(12) United States Patent
Kitada et al.

(10) Patent No.: US 11,107,970 B2
(45) Date of Patent: Aug. 31, 2021

(54) PIEZOELECTRIC ELEMENT AND METHOD FOR PRODUCING THE SAME, LIQUID EJECTION HEAD, AND PRINTER

(71) Applicant: Seiko Epson Corporation, Tokyo (JP)

(72) Inventors: Kazuya Kitada, Matsumoto (JP); Tsutomu Asakawa, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/583,467

(22) Filed: Sep. 26, 2019

(65) Prior Publication Data
US 2020/0105995 A1 Apr. 2, 2020

(30) Foreign Application Priority Data

Sep. 27, 2018 (JP) .............................. JP2018-181531

(51) Int. Cl.
*B41J 2/14* (2006.01)
*H01L 41/08* (2006.01)
(Continued)

(52) U.S. Cl.
CPC ...... *H01L 41/0815* (2013.01); *B41J 2/14233* (2013.01); *H01L 41/0471* (2013.01);
(Continued)

(58) Field of Classification Search
CPC ............. H01L 41/0471; H01L 41/0815; H01L 41/083; H01L 41/1873; H01L 41/297; B41J 2002/14258; B41J 2/14233
See application file for complete search history.

(56) References Cited

U.S. PATENT DOCUMENTS

2007/0126313 A1   6/2007  Ueno et al.
2013/0250011 A1*  9/2013  Sakai ................... H01L 41/0815
                                                347/71
(Continued)

FOREIGN PATENT DOCUMENTS

EP       3382766 A1     10/2018
JP     2011-155272 A     8/2011
(Continued)

OTHER PUBLICATIONS

Extended European Search Report for Patent Application No. EP 19200072.7 dated Dec. 19, 2019 (7 pages).

*Primary Examiner* — Sharon Polk
(74) *Attorney, Agent, or Firm* — Harness, Dickey & Pierce, P.L.C.

(57) ABSTRACT

A piezoelectric element including a first electrode provided above a base body, a first piezoelectric layer provided so as to be in contact with the base body and cover the first electrode, a second piezoelectric layer provided above the first piezoelectric layer, and a second electrode provided above the second piezoelectric layer, wherein the first piezoelectric layer includes a composite oxide that contains potassium and niobium and that has a perovskite-type structure containing potassium as a main component at an A-site, the second piezoelectric layer includes a composite oxide that contains potassium, sodium, and niobium and that has a perovskite-type structure, and the first piezoelectric layer has a higher potassium atomic concentration (atm %) than the second piezoelectric layer.

15 Claims, 11 Drawing Sheets

(51) Int. Cl.
*H01L 41/047* (2006.01)
*H01L 41/083* (2006.01)
*H01L 41/297* (2013.01)
*H01L 41/318* (2013.01)
*H01L 41/09* (2006.01)

(52) U.S. Cl.
CPC .......... *H01L 41/083* (2013.01); *H01L 41/297* (2013.01); *H01L 41/318* (2013.01); *B41J 2002/14258* (2013.01); *H01L 41/0973* (2013.01)

(56) References Cited

U.S. PATENT DOCUMENTS

2016/0284969 A1 9/2016 Sumi et al.
2017/0229637 A1 8/2017 Sakai et al.

FOREIGN PATENT DOCUMENTS

| JP | 2012-169467 A | 9/2012 |
| JP | 2014-135504 A | 7/2014 |
| JP | 2016-187019 A | 10/2016 |

* cited by examiner

| | FIRST PRECURSOR SOLUTION | | RATIO R | |
| --- | --- | --- | --- | --- |
| | COMPOSITION | DILUTION | AFTER STACKING TWO LAYERS | AFTER OCCURRENCE OF CRACK |
| EXAMPLE 1 | $KNbO_3$ | — | 0.80 | — |
| EXAMPLE 2 | $K_{1.02}NbO_3$ | — | 0.79 | — |
| EXAMPLE 3 | $K_{0.96}NbO_3$ | — | 0.78 | — |
| EXAMPLE 4 | $KNbO_3$ | 2-FOLD DILUTION | 0.81 | — |
| EXAMPLE 5 | $KNbO_3$ | 4-FOLD DILUTION | 0.80 | 0.89 |
| EXAMPLE 6 | $KNbO_3$ | 10-FOLD DILUTION | 0.79 | 0.93 |
| COMPARATIVE EXAMPLE 1 | $(K_{0.5}Na_{0.5})(Nb_{0.995}Mn_{0.005})O_3$ | — | 0.57 | 0.55 |
| COMPARATIVE EXAMPLE 2 | $NaNbO_3$ | — | 0.51 | — |

PIEZOELECTRIC ELEMENT AND METHOD FOR PRODUCING THE SAME, LIQUID EJECTION HEAD, AND PRINTER

The present application is based on, and claims priority from, JP Application Serial Number 2018-181531, filed Sep. 27, 2018, the disclosure of which is hereby incorporated by reference herein in its entirety.

BACKGROUND

1. Technical Field

The present disclosure relates to a piezoelectric element and a method for producing the same, a liquid ejection head, and a printer.

2. Related Art

Recently, elements utilizing a thin film have been increasing with the development of MEMS (Micro Electro Mechanical Systems) techniques, and a film thickness is reduced also for a piezoelectric element to be used in a liquid ejection head or the like. However, a thin film has a problem that a crack is likely to occur.

For example, JP-A-2012-169467 (Patent Document 1) describes that the occurrence of a crack can be suppressed by incorporating a predetermined amount of a silicone oil in a potassium sodium niobate $(K_{1-x}Na_x)NbO_3$: KNN)-based piezoelectric layer.

In Patent Document 1, the crystal plane orientation of the surface of the piezoelectric layer is not taken into consideration, and when the film thickness of the piezoelectric layer is increased, a minute crack that could not be confirmed at the observation magnification (500 times) in Patent Document 1 may occur. In the piezoelectric layer in which such a crack occurred, the crack may progress due to deformation accompanying the application of a voltage.

SUMMARY

An aspect of a piezoelectric element according to the present disclosure includes a first electrode provided above a base body, a first piezoelectric layer provided so as to be in contact with the base body and cover the first electrode, a second piezoelectric layer provided above the first piezoelectric layer, and a second electrode provided above the second piezoelectric layer, wherein the first piezoelectric layer includes a composite oxide that contains potassium and niobium and that has a perovskite-type structure containing potassium as a main component at an A-site, the second piezoelectric layer includes a composite oxide that contains potassium, sodium, and niobium and that has a perovskite-type structure, and the first piezoelectric layer has a higher potassium atomic concentration (atm %) than the second piezoelectric layer.

In the aspect of the piezoelectric element, in profiles in a depth direction of the first piezoelectric layer and the second piezoelectric layer obtained by secondary ion mass spectrometry, a potassium profile and a sodium profile may alternately have maximum values, and in the depth direction, a distance between a position of an interface between the first piezoelectric layer and the base body and a position of the maximum value closest to the interface among the plurality of maximum values of the potassium profile may be smaller than a distance between the position of the interface and a position of the maximum value closest to the interface among the plurality of maximum values of the sodium profile.

In the aspect of the piezoelectric element, in an X-ray diffraction pattern of the second piezoelectric layer, a ratio of a (100) plane peak intensity to a sum of the (100) plane peak intensity and a (110) plane peak intensity may be 0.60 or more.

In the aspect of the piezoelectric element, the ratio may be 0.75 or more.

In the aspect of the piezoelectric element, the base body may include a zirconium oxide layer, and the first piezoelectric layer may be in contact with the zirconium oxide layer.

In the aspect of the piezoelectric element, a sum of a film thickness of the first piezoelectric layer and a film thickness of the second piezoelectric layer may be 500 nm or more.

An aspect of a method for producing a piezoelectric element according to the present disclosure includes forming a first electrode above a base body, forming a first piezoelectric layer so as to be in contact with the base body and cover the first electrode, forming a second piezoelectric layer on the first piezoelectric layer, and forming a second electrode above the second piezoelectric layer, wherein the first piezoelectric layer includes a composite oxide that contains potassium and niobium and that has a perovskite-type structure containing potassium as a main component at an A-site, the second piezoelectric layer includes a composite oxide that contains potassium, sodium, and niobium and that has a perovskite-type structure, and the first piezoelectric layer has a higher potassium atomic concentration (atm %) than the second piezoelectric layer.

An aspect of a liquid ejection head according to the present disclosure includes one aspect of the piezoelectric element and a nozzle plate provided with a nozzle hole for ejecting a liquid, wherein the base body includes a flow path forming substrate provided with a pressure generating chamber whose volume is changed by the piezoelectric element and a supply flow path, which communicates with the pressure generating chamber, and through which the liquid is supplied to the pressure generating chamber, and the nozzle hole communicates with the supply flow path.

An aspect of a printer according to the present disclosure includes one aspect of the liquid ejection head, a conveyance mechanism for relatively moving a recording medium with respect to the liquid ejection head, and a control unit that controls the liquid ejection head and the conveyance mechanism.

DESCRIPTION OF EXEMPLARY EMBODIMENTS

Hereinafter, preferred embodiments of the present disclosure will be described in detail with reference to the drawings. Note that the embodiments described below are not intended to unduly limit the content of the present disclosure described in the appended claims. Further, not all the configurations described below are necessarily essential components of the present disclosure.

1. PIEZOELECTRIC ELEMENT

Figure 1:
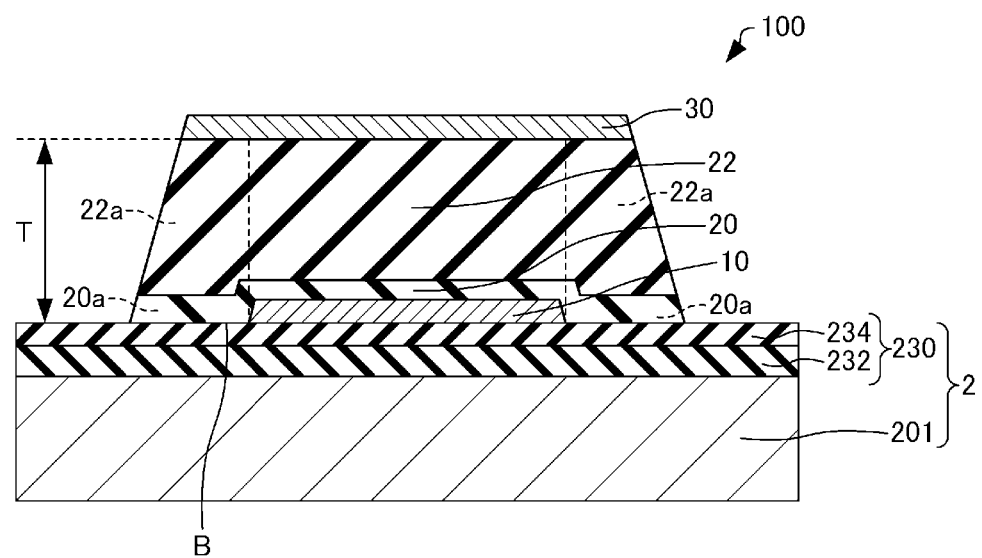
FIG. 1 is a cross-sectional view schematically showing a piezoelectric element according to an embodiment.

First, a piezoelectric element according to this embodiment will be described with reference to the drawings. FIG. 1 is a cross-sectional view schematically showing a piezoelectric element 100 according to this embodiment.

As shown in FIG. 1, the piezoelectric element 100 includes a first electrode 10, a first piezoelectric layer 20, a second piezoelectric layer 22, and a second electrode 30. The piezoelectric element 100 is provided above a base body 2. In an example shown in the drawing, the piezoelectric element 100 is provided on the base body 2.

In the description according to the present disclosure, when the term "above" is used in, for example, a sentence such as " "above" a specific object (hereinafter referred to as "A"), another specific object (hereinafter referred to as "B") is formed", the term "above" is used while assuming that the term includes a case where B is formed directly on A, and a case where B is formed on A through another object.

The base body 2 is, for example, a flat plate formed of a semiconductor, an insulator, or the like. The base body 2 may be a single layer or a stacked body in which a plurality of layers are stacked. The internal structure of the base body 2 is not limited as long as an upper face has a planar shape, and may be a structure in which a space or the like is formed inside.

The base body 2 includes, for example, a vibrating plate 230 that can be deformed by the action of the piezoelectric layer 20 or 22. In the example shown in the drawing, the vibrating plate 230 includes a silicon oxide layer 232 and a zirconium oxide layer 234 provided on the silicon oxide layer 232. The silicon oxide layer 232 is a layer containing silicon and oxygen, and is, for example, a silica ($SiO_2$) layer. The zirconium oxide layer 234 is a layer containing zirconium and oxygen, and is, for example, a zirconia ($ZrO_2$) layer. The crystal structure of the zirconia layer is a monoclinic crystal, a tetragonal crystal, a cubic crystal, or a mixed crystal thereof. In the example shown in the drawing, the base body 2 includes a silicon substrate 201, and the vibrating plate 230 is provided on the silicon substrate 201.

The zirconium oxide layer 234 may be a layer containing oxygen, and in place of the zirconium oxide layer 234, a titanium oxide layer, an aluminum oxide layer, a tantalum oxide layer, or the like may be used. Further, the zirconium oxide layer 234 may not be provided, and the first electrode 10 and the first piezoelectric layer 20 may be provided on the silicon oxide layer 232.

The first electrode 10 is provided above the base body 2. In the example shown in the drawing, the first electrode 10 is provided on the base body 2. The form of the first electrode 10 is, for example, a layered form. The film thickness of the first electrode 10 is, for example, 3 nm or more and 200 nm or less. The first electrode 10 is, for example, a metal layer such as a platinum layer or an iridium layer, an electrically conductive oxide layer thereof, a strontium ruthenate ($SrRuO_3$: SRO) layer, or the like. The first electrode 10 may have a structure in which a plurality of layers given above as examples are stacked.

The first electrode 10 is one of the electrodes for applying a voltage to the piezoelectric layers 20 and 22. The first electrode 10 is a lower electrode provided below the first piezoelectric layer 20.

Although not shown in the drawing, an adhesive layer for improving the adhesion between the first electrode 10 and the base body 2 may be provided between the first electrode 10 and the base body 2. The adhesive layer is, for example, a titanium layer, a titanium oxide layer, or the like.

The first piezoelectric layer 20 is provided so as to be in contact with the base body 2 and cover the first electrode 10. In the example shown in the drawing, the first piezoelectric layer 20 is in contact with the zirconium oxide layer 234. The first piezoelectric layer 20 is provided on the zirconium oxide layer 234 and on the first electrode 10. The first piezoelectric layer 20 has an interface B with the base body 2.

The film thickness of the first piezoelectric layer 20 is, for example, 5 nm or more and 300 nm or less. However, the first piezoelectric layer 20 has a different composition from the second piezoelectric layer 22 and has a different degree of charge deviation from the second piezoelectric layer 22, and therefore, the film thickness of the first piezoelectric layer 20 is preferably small from the viewpoint of electrical properties. Specifically, the film thickness of the first piezoelectric layer 20 is preferably 5 nm or more and 25 nm or less.

The first piezoelectric layer 20 includes a composite oxide that contains potassium (K) and niobium (Nb) and that has a perovskite-type structure containing potassium as a main component at an A-site. The phrase "containing potassium as a main component at an A-site" means that the potassium atomic concentration at the A-site is the highest among the atoms constituting the A-site. The first piezoelectric layer 20 is, for examle, a $KNbO_3$ (KN) layer, and when it is $(K_xNa_{(1-x)})NbO_3$, a relation: $0.5<x<1$ is satisfied. The first piezoelectric layer 20 may be a $(K_{0.45}Na_{0.40}L_{0.15})NbO_3$ layer. The first piezoelectric layer 20 has a higher potassium atomic concentration (atm %) than the second piezoelectric layer 22.

It can be confirmed that the main component at the A-site of the first piezoelectric layer 20 is potassium and that the potassium atomic concentration (atm %) in the first piezoelectric layer 20 is higher than the potassium atomic concentration (atm %) in the second piezoelectric layer 22 by, for example, a depth direction analysis of XPS (X-ray Photoelectron Spectroscopy), TEM-EDS (Transmission Electron Microscope-Energy Dispersive X-ray Spectroscopy), or the like.

The second piezoelectric layer 22 is provided on the first piezoelectric layer 20. The film thickness of the second piezoelectric layer 22 is larger than the film thickness of the first piezoelectric layer 20. The second piezoelectric layer 22 includes a composite oxide that contains potassium (K), sodium (Na), and niobium (Nb) and that has a perovskite-type structure. The second piezoelectric layer may be constituted by stacking a plurality of KNN layers. The second piezoelectric layer 22 may further contain manganese (Mn). The second piezoelectric layer 22 may be constituted by stacking a plurality of KNN layers to which manganese was added. By including manganese in the second piezoelectric layer 22, a leakage current in the piezoelectric element 100 can be reduced. The piezoelectric layers 20 and 22 can be deformed by applying a voltage between the first electrode 10 and the second electrode 30.

A sum T of the film thickness of the first piezoelectric layer 20 and the film thickness of the second piezoelectric layer 22 is, for example, 500 nm or more and 2 µm or less. The sum T is the maximum value of the sum of the film thickness of the first piezoelectric layer 20 and the film thickness of the second piezoelectric layer 22. In the example shown in the drawing, the sum T is a sum of the film thickness of a first portion 20a provided on the zirconium oxide layer 234 of the first piezoelectric layer 20 and the film thickness of a second portion 22a provided on the first portion 20a of the second piezoelectric layer 22, and is a distance between the zirconium oxide layer 234 and the second electrode 30. The sum T can be measured by, for example, a cross section scanning electron microscope (SEM).

In an X-ray diffraction (XRD) pattern of the second piezoelectric layer 22, a ratio R of a (100) plane peak intensity to a sum of the (100) plane peak intensity and a (110) plane peak intensity is 0.60 or more. The ratio R is preferably 0.65 or more, more preferably 0.70 or more, further more preferably 0.75 or more.

Figure 2:
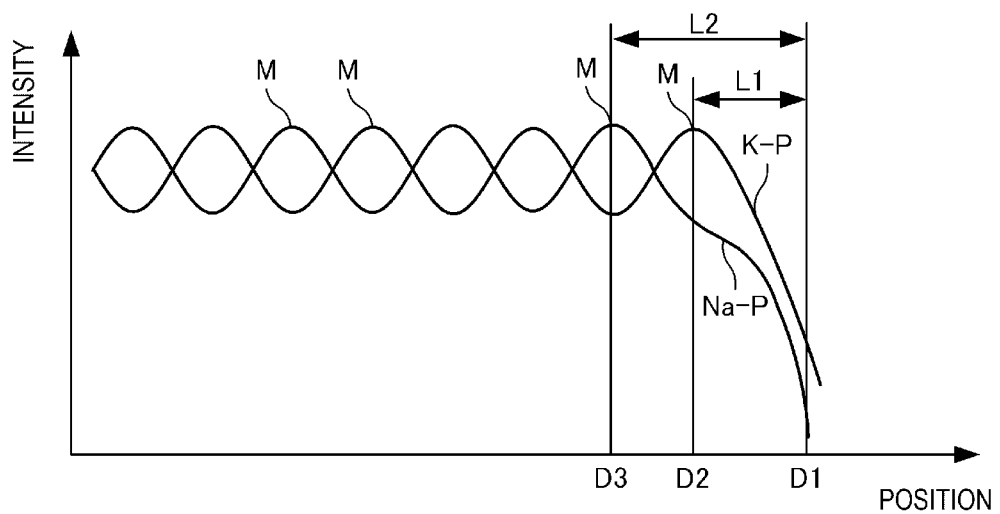
FIG. 2 is a view schematically showing profiles in a depth direction of a first piezoelectric layer and a second piezoelectric layer obtained by secondary ion mass spectrometry.

Here, FIG. 2 is a view schematically showing profiles in a depth direction of the first piezoelectric layer 20 and the second piezoelectric layer 22 obtained by SIMS. In FIG. 2, a potassium profile K—P and a sodium profile Na—P are shown. The horizontal axis in FIG. 2 represents a position in a depth direction, that is, a film thickness direction of the piezoelectric layers 20 and 22. The vertical axis in FIG. 2 represents an intensity detected by SIMS.

As shown in FIG. 2, the potassium profile K—P and the sodium profile Na—P, for example, alternately have maximum values M. The profiles K—P and Na—P have a plurality of maximum values M. In the depth direction, a distance L1 between a position D1 of the interface B between the first piezoelectric layer 20 and the base body 2 and a position D2 of the maximum value M closest to the interface B among the plurality of maximum values M of the profile K—P is smaller than a distance L2 between the position D1 of the interface B and a position D3 of the maximum value M closest to the interface B among the plurality of maximum values M of the profile Na—P.

When the piezoelectric layer is constituted only by a KNN layer, $NaNbO_3$ has a lower crystallization temperature and is more easily crystallized than $KNbO_3$, and therefore sodium is likely to exist much at the interface with the base body.

The position D1 of the interface B between the first piezoelectric layer 20 and the base body 2 is a position where the intensity becomes one half of the average in a niobium profile not shown in the drawing. This also applies to the below-mentioned FIGS. 17 and 18.

As shown in FIG. 1, the second electrode 30 is provided above the second piezoelectric layer 22. In the example shown in the drawing, the second electrode 30 is provided on the second piezoelectric layer 22. Although not shown in the drawing, the second electrode 30 may be further provided on side faces of the piezoelectric layers 20 and 22 and on the base body 2.

The form of the second electrode 30 is, for example, a layered form. The film thickness of the second electrode 30 is, for example, 15 nm or more and 300 nm or less. The second electrode 30 is, for example, a metal layer such as an iridium layer or a platinum layer, an electrically conductive oxide layer thereof, a strontium ruthenate layer, or the like. The second electrode 30 may have a structure in which a plurality of layers given above as examples are stacked.

The second electrode 30 is the other electrode for applying a voltage to the piezoelectric layers 20 and 22. The second electrode 30 is an upper electrode provided above the second piezoelectric layer 22.

The piezoelectric element 100 has, for example, the following characteristics.

In the piezoelectric element 100, the first piezoelectric layer 20 provided so as to be in contact with the base body 2 and cover the first electrode 10 and the second piezoelectric layer 22 provided on the first piezoelectric layer 20 are included, and the first piezoelectric layer 20 includes a composite oxide that contains potassium and niobium and that has a perovskite-type structure containing potassium as a main component at an A-site, the second piezoelectric layer 22 includes a composite oxide that contains potassium, sodium, and niobium and that has a perovskite-type structure, and the first piezoelectric layer 20 has a higher potassium atomic concentration (atm %) than the second piezoelectric layer 22. Therefore, in the piezoelectric element 100, for example, as compared with a case where the first piezoelectric layer is not included and the second piezoelectric layer is in contact with the base body, a crack is less likely to occur in the portions 20a and 22a of the piezoelectric layers 20 and 22 as shown in the below-mentioned "5. Examples and Comparative Examples".

In the piezoelectric element 100, the ratio R is 0.60 or more, preferably 0.75 or more. Therefore, in the piezoelectric element 100, a crack is less likely to occur in the portions 20a and 22a of the piezoelectric layers 20 and 22 as shown in the below-mentioned "5. Examples and Comparative Examples".

In the piezoelectric element 100, the sum T of the film thickness of the first piezoelectric layer 20 and the film thickness of the second piezoelectric layer 22 is 500 nm or more. As the sum T is larger, a crack is more likely to occur, however, in the piezoelectric element 100, even when the sum T is 500 nm or more, a crack is less likely to occur in the portions 20a and 22a of the piezoelectric layers 20 and 22.

2. METHOD FOR PRODUCING PIEZOELECTRIC ELEMENT

Figure 3:
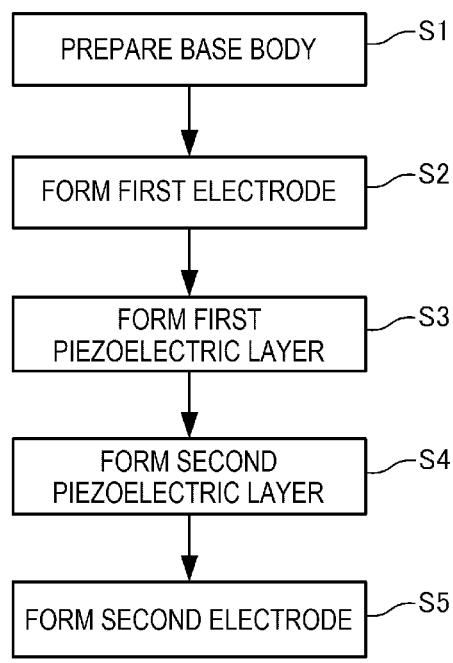
FIG. 3 is a flowchart for illustrating a method for producing a piezoelectric element according to an embodiment.

Next, a method for producing the piezoelectric element 100 according to this embodiment will be described with reference to the drawings. FIG. 3 is a flowchart for illustrating the method for producing the piezoelectric element 100 according to this embodiment.

As shown in FIG. 1, the base body 2 is prepared (Step S1). Specifically, the silicon oxide layer 232 is formed by thermal oxidation of the silicon substrate 201. Subsequently, a zirconium layer is formed on the silicon oxide layer 232 by a sputtering method or the like, and the zirconium oxide layer 234 is formed by thermal oxidation of the zirconium layer. By the above step, the base body 2 can be prepared.

Subsequently, the first electrode 10 is formed on the base body 2 (Step S2). The first electrode 10 is formed by, for example, a sputtering method, a vacuum deposition method, or the like. Subsequently, the first electrode 10 is patterned by, for example, photolithography and etching.

Subsequently, the first piezoelectric layer 20 that is in contact with the base body 2 and that covers the first electrode 10 is formed (Step S3). The first piezoelectric layer 20 is formed by, for example, a chemical solution deposition (CSD) method such as a sol-gel method or a metal organic decomposition (MOD) method. Hereinafter, amethod for forming the first piezoelectric layer 20 will be described.

First, a metal complex containing potassium and a metal complex containing niobium are dissolved or dispersed in an organic solvent, thereby preparing a first precursor solution.

Subsequently, the prepared first precursor solution is coated on the first electrode 10 using a spin-coating method or the like, thereby forming a precursor layer (coating step). Subsequently, the precursor layer is dried by heating to, for example, 130° C. or higher and 250° C. or lower for a given time (drying step), and further, the dried precursor layer is degreased by heating to, for example, 300° C. or higher and 450° C. or lower and maintaining the layer for a given time (degreasing step). Subsequently, the degreased precursor layer is crystallized by heating to, for example, 600° C. or higher and 750° C. or lower and maintaining the layer at this temperature for a given time (firing step). By the abovementioned steps, the first piezoelectric layer 20 composed of a KN layer can be formed.

Subsequently, the second piezoelectric layer 22 is formed on the first piezoelectric layer 20 (Step S4). In the step of forming the second piezoelectric layer 22, a second precursor solution is used in place of the first precursor solution. The second precursor solution is prepared by, for example, dissolving or dispersing a metal complex containing potassium, a metal complex containing sodium, a metal complex containing niobium, and a metal complex containing magnesium in an organic solvent.

Then, the steps from the coating step to the firing step are performed for the prepared second precursor solution in the same manner as the steps of forming the first piezoelectric layer 20. Subsequently, the steps from the coating step to the firing step are repeated a plurality of times. By doing this, the second piezoelectric layer 22 composed of a plurality of KNN layers to which manganese is added can be formed.

As a heating device used in the drying step and the degreasing step, for example, a hot plate is exemplified. As a heating device used in the firing step, for example, a rapid thermal annealing (RTA) device performing heating by irradiation from an infrared lamp is exemplified.

Examples of the metal complex containing potassium used for the preparation of the first precursor solution and the second precursor solution include potassium 2-ethylhexanoate and potassium acetate. Examples of the metal complex containing sodium include sodium 2-ethylhexanoate and sodium acetate. Examples of the metal complex containing niobium include niobium 2-ethylhexanoate and pentaethoxy niobium. Examples of the metal complex containing manganese include manganese 2-ethylhexanoate. Examples of the metal complex containing calcium include calcium 2-ethylhexanoate. Two or more types of metal complexes may be used in combination. For example, as the metal complex containing potassium, potassium 2-ethylhexanoate and potassium acetate may be used in combination.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and a mixed solvent thereof.

Subsequently, the second electrode 30 is formed on the second piezoelectric layer 22 (Step S5). The second electrode 30 is formed by, for example, a sputtering method, a vacuum deposition method, or the like. Subsequently, the second electrode 30 and the piezoelectric layers 20 and 22 are patterned by, for example, photolithography and etching. The second electrode 30 and the piezoelectric layers 20 and 22 may be patterned in separate steps.

By the above steps, the piezoelectric element 100 can be produced.

In the method for producing the piezoelectric element 100, the piezoelectric element 100 in which a crack is less likely to occur can be produced.

3. LIQUID EJECTION HEAD

Figure 4:
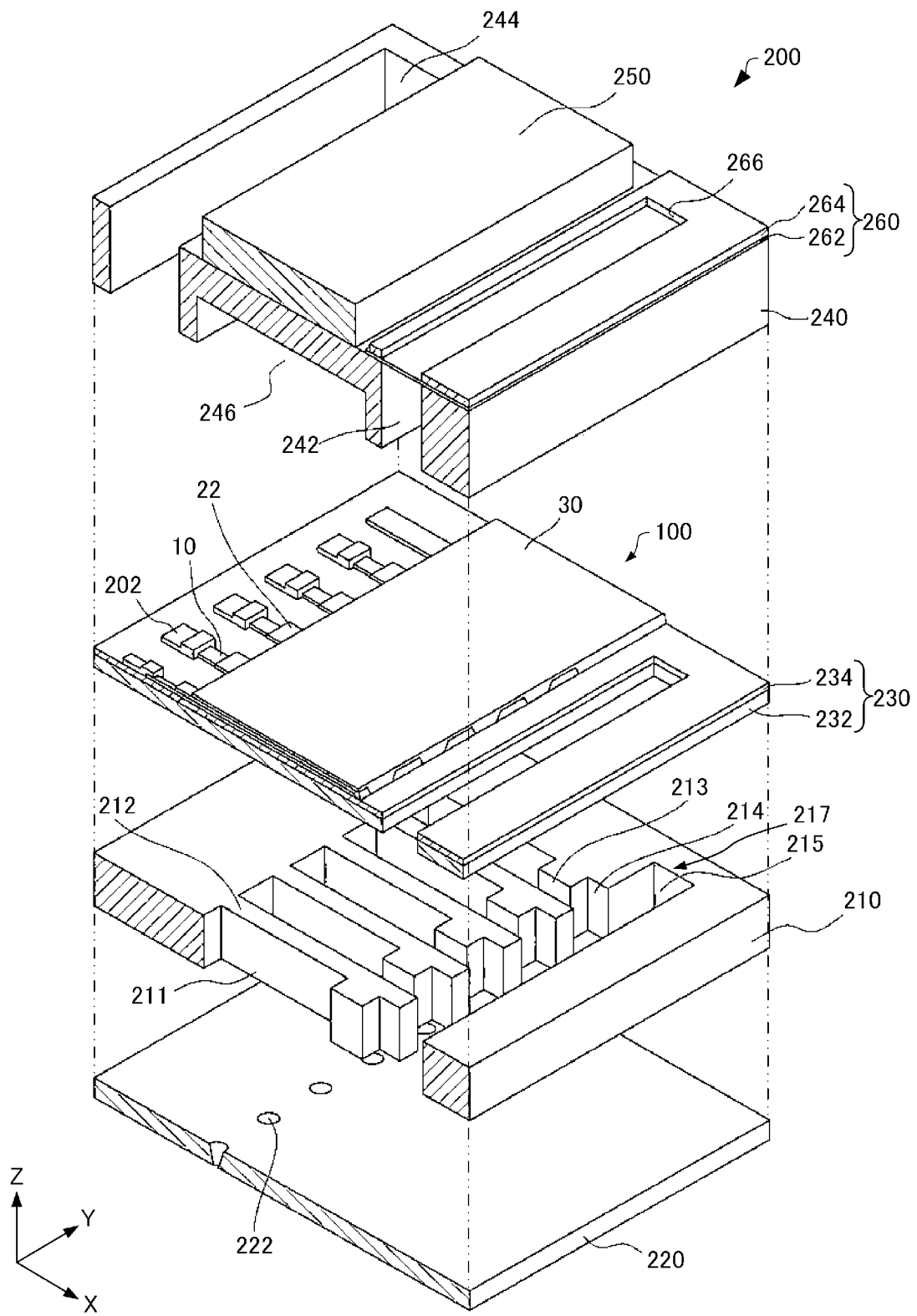
FIG. 4 is an exploded perspective view schematically showing a liquid ejection head according to an embodiment.
Figure 5:
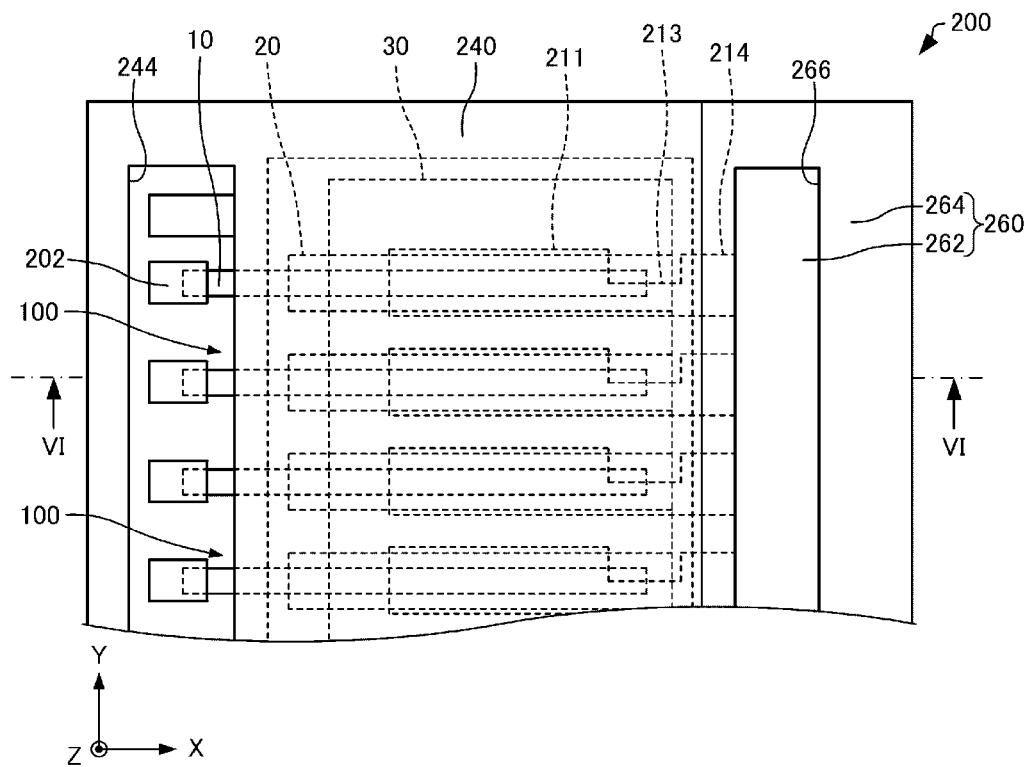
FIG. 5 is a plan view schematically showing the liquid ejection head according to the embodiment.
Figure 6:
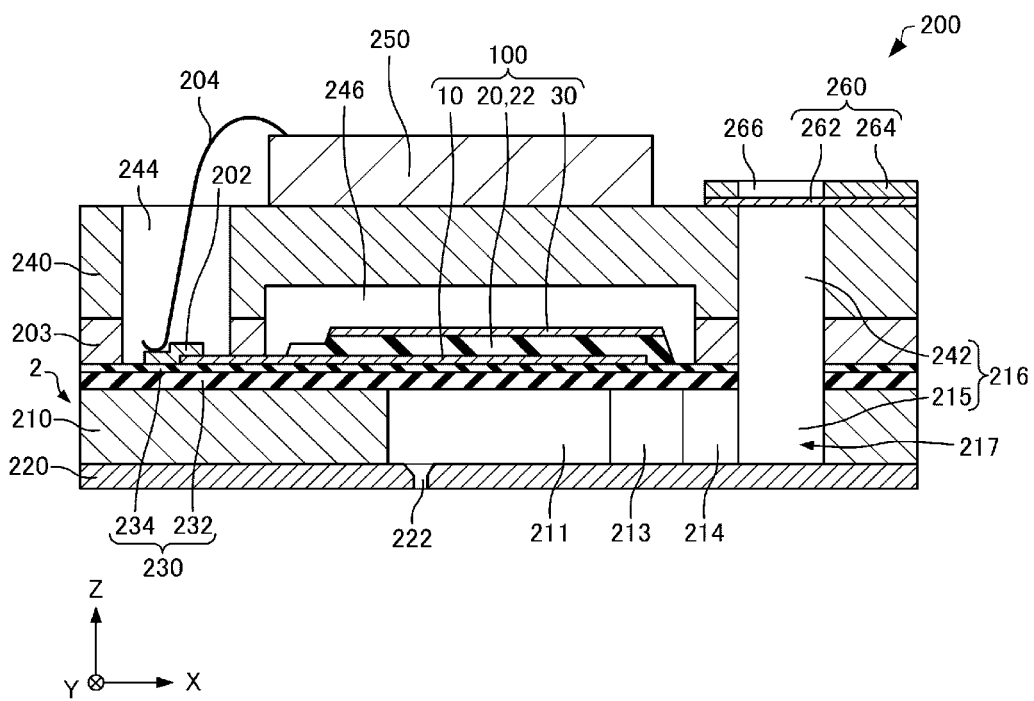
FIG. 6 is a cross-sectional view schematically showing the liquid ejection head according to the embodiment.

Next, a liquid ejection head according to this embodiment will be described with reference to the drawings. FIG. 4 is an exploded perspective view schematically showing a liquid ejection head 200 according to this embodiment. FIG. 5 is a plan view schematically showing the liquid ejection head 200 according to this embodiment. FIG. 6 is a cross-sectional view taken along the line VI-VI in FIG. 5 schematically showing the liquid ejection head 200 according to this embodiment. In FIGS. 4 to 6, an X axis, a Y axis, and a Z axis are shown as three axes orthogonal to one another. Further, in FIGS. 4 and 6, the piezoelectric element 100 is shown in a simplified manner.

As shown in FIGS. 4 to 6, the liquid ejection head 200 includes, for example, a base body 2, a piezoelectric element 100, a flow path forming substrate 210, a nozzle plate 220, a vibrating plate 230, a protective substrate 240, a circuit board 250, and a compliance substrate 260. The base body 2 includes the flow path forming substrate 210 and the vibrating plate 230. In FIG. 5, illustration of the circuit board 250 is omitted for convenience.

The flow path forming substrate 210 is, for example, a silicon substrate. In the flow path forming substrate 210, a pressure generating chamber 211 is provided. The pressure generating chamber 211 is divided by a plurality of partitions 212. The volume of the pressure generating chamber 211 is changed by the piezoelectric element 100.

In the flow path forming substrate 210, a supply path 213 and a communication path 214 are provided in an end portion in a positive X axis direction of the pressure generating chamber 211. The supply path 213 is configured such that an opening area thereof becomes smaller by narrowing the end portion in the positive X axis direction of the pressure generating chamber 211 from the Y axis direction. The size in the Y axis direction of the communication path 214 is, for example, the same as the size in the Y axis direction of the pressure generating chamber 211. In the positive X axis direction of the communication path 214, a communication part 215 is provided. The communication part 215 constitutes a portion of a manifold 216. The manifold 216 becomes a common liquid chamber of the respective pressure generating chambers 211. In this manner, in the flow path forming substrate 210, a supply flow path 217 composed of the supply path 213, the communication path 214, and the communication part 215, and the pressure generating chamber 211 are formed. The supply flow path 217 communicates with the pressure generating chamber 211 and supplies a liquid to the pressure generating chamber 211.

The nozzle plate 220 is provided in a face at one side of the flow path forming substrate 210. A material of the nozzle plate 220 is, for example, steel use stainless (SUS). The nozzle plate 220 is joined to the flow path forming substrate 210 with, for example, an adhesive, a heat-welding film, or the like. In the nozzle plate 220, nozzle holes 222 are arranged side by side along the Y axis. The nozzle holes 222 communicate with the pressure generating chamber 211.

The vibrating plate 230 is provided in a face at the other side of the flow path forming substrate 210. The vibrating plate 230 is constituted by, for example, a silicon oxide layer 232 provided on the flow path forming substrate 210 and a zirconium oxide layer 234 provided on the silicon oxide layer 232.

The piezoelectric element 100 is, for example, provided on the vibrating plate 230. A plurality of piezoelectric elements 100 are provided. The number of piezoelectric elements 100 is not particularly limited.

In the liquid ejection head 200, by deformation of the piezoelectric layers 20 and 22 having an electromechanical conversion property, the vibrating plate 230 and the first electrode 10 are displaced. That is, in the liquid ejection head 200, the vibrating plate 230 and the first electrode 10 practically have a function as a vibrating plate. The vibrating plate 230 may be omitted and only the first electrode 10 may be made to function as a vibrating plate. When the first electrode 10 is directly provided on the flow path forming substrate 210, the first electrode 10 is preferably protected by an insulating protective film or the like so that a liquid does not come in contact with the first electrode 10.

The first electrode 10 is constituted as an individual electrode independent for each pressure generating chamber 211. The size in the Y axis direction of the first electrode 10 is smaller than the size in the Y axis direction of the pressure generating chamber 211. The size in the X axis direction of the first electrode 10 is larger than the size in the X axis direction of the pressure generating chamber 211. In the X axis direction, both end portions of the first electrode 10 are located outside both end portions of the pressure generating chamber 211. To the end portion in the negative X axis direction of the first electrode 10, a lead electrode 202 is coupled.

The size in the Y axis direction of the first piezoelectric layer 20 is, for example, larger than the size in the Y axis direction of the first electrode 10. The size in the X axis direction of the first piezoelectric layer 20 is, for example, larger than the size in the X axis direction of the pressure generating chamber 211. The end portion in the positive X axis direction of the first piezoelectric layer 20 is located, for example, outside the end portion in the positive X axis direction of the first electrode 10. The end portion in the positive X axis direction of the first electrode 10 is covered with the first piezoelectric layer 20. On the other hand, the end portion in the negative X axis direction of the first piezoelectric layer 20 is located, for example, inside the end portion in the negative X axis direction side of the first electrode 10. The end portion in the negative X axis direction side of the first electrode 10 is not covered with the first piezoelectric layer 20.

The second electrode 30 is, for example, continuously provided on the second piezoelectric layer 22 and the vibrating plate 230. The second electrode 30 is constituted as a common electrode common to the plurality of piezoelectric elements 100.

The protective substrate 240 is joined to the flow path forming substrate 210 with an adhesive 203. In the protective substrate 240, a through hole 242 is provided. In the example shown in the drawing, the through hole 242 passes through the protective substrate 240 in the Z axis direction, and communicates with the communication part 215. The through hole 242 and the communication part 215 constitute the manifold 216 serving as a liquid chamber common to the individual pressure generating chambers 211. Further, in the protective substrate 240, a through hole 244 passing through the protective substrate 240 in the Z axis direction is provided. In the through hole 244, the end portion of the lead electrode 202 is located.

In the protective substrate 240, an opening part 246 is provided. The opening part 246 is a space for preventing inhibition of driving of the piezoelectric element 100. The opening part 246 may be sealed or may not be sealed.

The circuit board 250 is provided on the protective substrate 240. The circuit board 250 includes a semiconductor integrated circuit (IC) for driving the piezoelectric element 100. The circuit board 250 and the lead electrode 202 are electrically coupled to each other through a coupling wire 204.

The compliance substrate 260 is provided on the protective substrate 240. The compliance substrate 260 includes a sealing layer 262 provided on the protective substrate 240, and a fixing plate 264 provided on the sealing layer 262. The sealing layer 262 is a layer for sealing the manifold 216. The sealing layer 262 has, for example, flexibility. In the fixing plate 264, a through hole 266 is provided. The through hole 266 passes through the fixing plate 264 in the Z axis direction. The through hole 266 is provided at a position overlapping the manifold 216 when seen from the Z axis direction.

4. PRINTER

Figure 7:
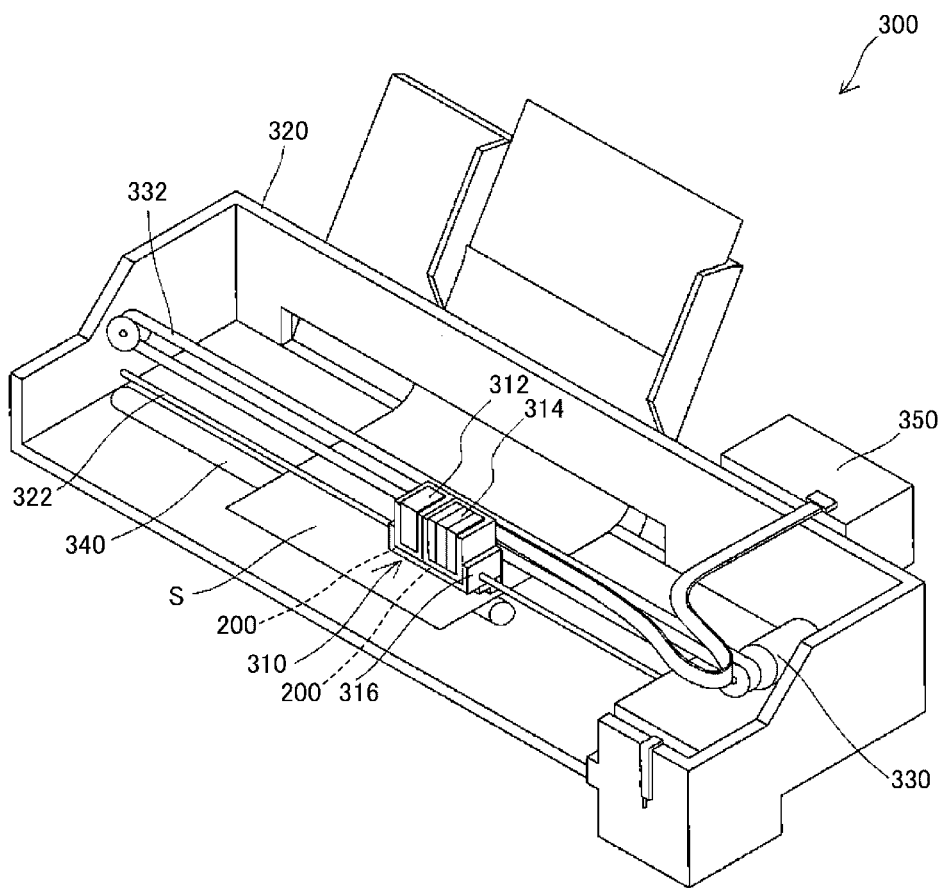
FIG. 7 is a perspective view schematically showing a printer according to an embodiment.

Next, a printer according to this embodiment will be described with reference to the drawing. FIG. 7 is a perspective view schematically showing a printer 300 according to this embodiment.

The printer 300 is an inkjet-type printer. As shown in FIG. 7, the printer 300 includes a head unit 310. The head unit 310 includes, for example, a liquid ejection head 200. The number of liquid ejection heads 200 is not particularly limited. In the head unit 310, cartridges 312 and 314 constituting a supply unit are detachably provided. A carriage 316 on which the head unit 310 is mounted is provided movably in an axial direction to a carriage shaft 322 attached to a device body 320 and ejects a liquid supplied from a liquid supply unit.

The liquid as used herein may be any as long as it is a material in a state when a substance is a liquid phase, and a material in a liquid state like a sol, a gel, or the like is also included in the liquid. Further, not only a liquid as one state of a substance, but also a material in which particles of a functional material composed of a solid such as a pigment or metal particles are dissolved, dispersed, or mixed in a solvent, etc. are included in the liquid. Typical examples of the liquid include an ink and a liquid crystal emulsifier. The ink is assumed to include various liquid compositions such as general aqueous inks and oily inks, gel inks, and hot-melt inks.

In the printer 300, a driving force of a drive motor 330 is transmitted to the carriage 316 through a plurality of gears (not shown) and a timing belt 332, and thereby the carriage 316 on which the head unit 310 is mounted is moved along the carriage shaft 322. On the other hand, the device body 320 is provided with a conveyance roller 340 as a conveyance mechanism for relatively moving a sheet S being a recording medium such as paper with respect to the liquid ejection head. The conveyance mechanism for conveying the sheet S is not limited to the conveyance roller, and may be a belt, a drum, or the like.

The printer 300 includes a printer controller 350 as a control unit that controls the liquid ejection head 200 and the conveyance roller. The printer controller 350 is electrically coupled to the circuit board 250 of the liquid ejection head 200. The printer controller 350 includes, for example, a random access memory (RAM) temporarily storing various data, a read only memory (ROM) storing a control program or the like, a central processing unit (CPU), and a drive signal generation circuit generating a drive signal to be supplied to the liquid ejection head 200, and the like.

The piezoelectric element 100 can be used in a wide range of applications without being limited to the liquid ejection head and the printer. The piezoelectric element 100 can be favorably used in, for example, various sensors such as a gyro sensor and an acceleration sensor, a timing device such as a tuning fork oscillator, and an ultrasonic device such as an ultrasonic motor.

5. EXAMPLES AND COMPARATIVE EXAMPLES

Hereinafter, the present disclosure will be more specifically described by showing Examples and Comparative Examples. The present disclosure is by no means limited to the following Examples and Comparative Examples.

5.1. PREPARATION OF SAMPLES

5.1.1. Example 1

A $SiO_2$ layer was formed by thermal oxidation of a 6-inch silicon substrate. Subsequently, a zirconium layer was formed on the $SiO_2$ layer by a sputtering method, followed by thermal oxidation, whereby a $ZrO_2$ layer was formed.

A first precursor solution was prepared to give $KNbO_3$ using a solution composed of potassium 2-ethylhexanoate and a niobium 2-ethylhexanoate solution. Subsequently, the first precursor solution was coated on the $ZrO_2$ layer by a spin-coating method, whereby a first precursor layer was formed. Subsequently, the first precursor layer was dried by heating to 180° C., and degreased by further heating to 380° C., and thereafter, a heating treatment was performed at 600° C. for 3 minutes using an RTA device. By the above steps, a KN layer was formed as a first piezoelectric layer. When observation was performed by SEM, the film thickness of the KN layer was 84 nm.

Subsequently, a second precursor solution was prepared to give $(K_{0.5}Na_{0.5})(Nb_{0.995}Mn_{0.005})O_3$ using a solution composed of potassium 2-ethylhexanoate, sodium 2-ethylhexanoate, a niobium 2-ethylhexanoate solution, and manganese 2-ethylhexanoate. Subsequently, the second precursor solution was coated on the KN layer by a spin-coating method, whereby a second precursor layer was formed. Then, drying and degreasing were performed in the same manner as the first precursor layer, and thereafter, a heating treatment was performed at 750° C. for 3 minutes using an RTA device. By the above steps, a KNN layer was formed. Further, the procedure from the coating of the second precursor solution to the heating treatment using the RTA device was repeatedly performed until a crack occurred, whereby a plurality of KNN layers to which manganese was added were formed as a second piezoelectric layer.

5.1.2. Example 2

Example 2 is the same as Example 1 except that the first precursor solution was prepared to give $K_{1.02}NbO_3$.

5.1.3. Example 3

Example 3 is the same as Example 1 except that the first precursor solution was prepared to give $K_{0.96}NbO_3$.

5.1.4. Example 4

Example 4 is the same as Example 1 except that the first precursor solution of Example 1 was diluted 2-fold and the film thickness of the KN layer was set to 70 nm.

5.1.5. Example 5

Example 5 is the same as Example 1 except that the first precursor solution of Example 1 was diluted 4-fold and the film thickness of the KN layer was set to 25 nm.

5.1.6. Example 6

Example 6 is the same as Example 1 except that the first precursor solution of Example 1 was diluted 10-fold and the film thickness of the KN layer was set to 10 nm.

5.1.7. Comparative Example 1

Comparative Example 1 is the same as Example 1 except that the first precursor solution was prepared to give $(K_{0.5}Na_{0.5})(Nb_{0.995}Mn_{0.005})O_3$. That is, in Comparative Example 1, a KNN layer was formed in place of the KN layer in Example 1.

5.1.8. Comparative Example 2

Comparative Example 2 is the same as Example 1 except that the first precursor solution was prepared to give $NaNbO_3$ (NN). That is, in Comparative Example 2, an NN layer was formed in place of the KN layer in Example 1.

5.2. CRACK OBSERVATION

Crack observation was performed using a phase-contrast microscope "OPTIPHOT 200" manufactured by Nikon Corporation with a 10× ocular lens and a 100× objective lens after the heating treatment of the respective precursor layers with an RTA device.

The sum of the film thickness of the first piezoelectric layer and the film thickness of the second piezoelectric layer when a crack occurred, that is, the film thickness when a crack occurred was about 1100 nm in Examples 1 to 6, but from about 350 nm to 450 nm in Comparative Examples 1 and 2. For example, the film thickness when a crack occurred was 1050 nm in Examples 5 and 6, and 450 nm in Comparative Example 1.

Accordingly, it was found that when the first piezoelectric layer is a KN layer, a crack is less likely to occur as compared with a case where the first piezoelectric layer is a KNN layer or an NN layer.

5.3. XRD MEASUREMENT

The samples prepared as described above were subjected to XRD measurement. In XRD, measurement was performed using D8 Discover with GADDS manufactured by Bruker at a tube voltage of 50 kV, a tube current of 100 mA, a detector distance of 15 cm, a collimator diameter of 0.1 mm, and a measurement time of 120 sec. Then, the obtained two-dimensional data were converted to an X-ray diffraction intensity curve by the attached software with a 2θ range of 20° to 50°, a χ range of −95° to −85°, and a step width of 0.02° and using Bin normalized as an intensity normalization method.

Figure 8:
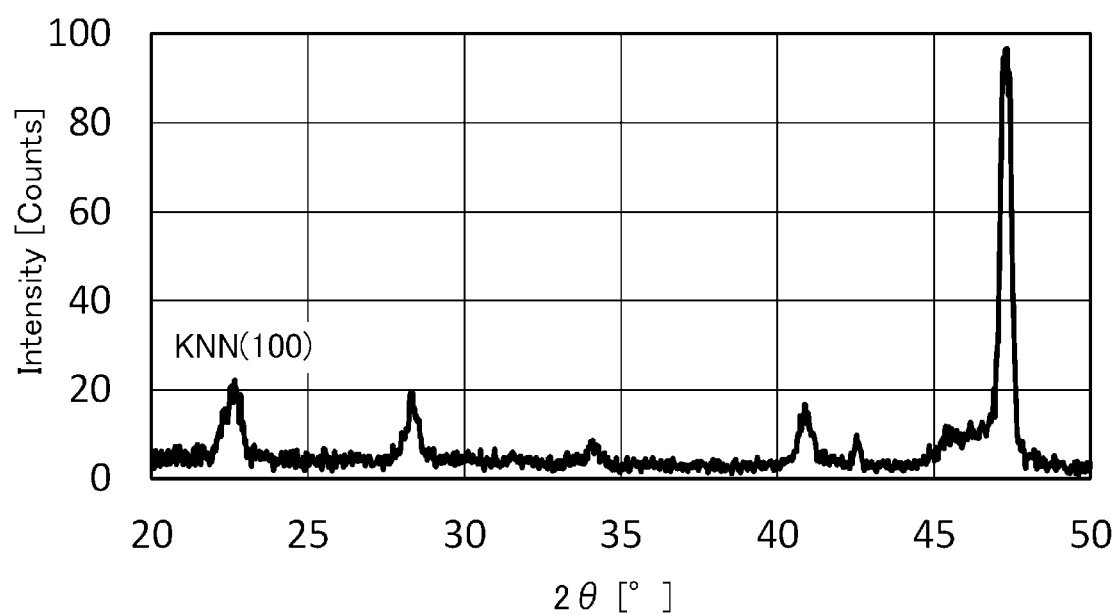
FIG. 8 shows X-ray diffraction measurement results of Example 1.
Figure 9:
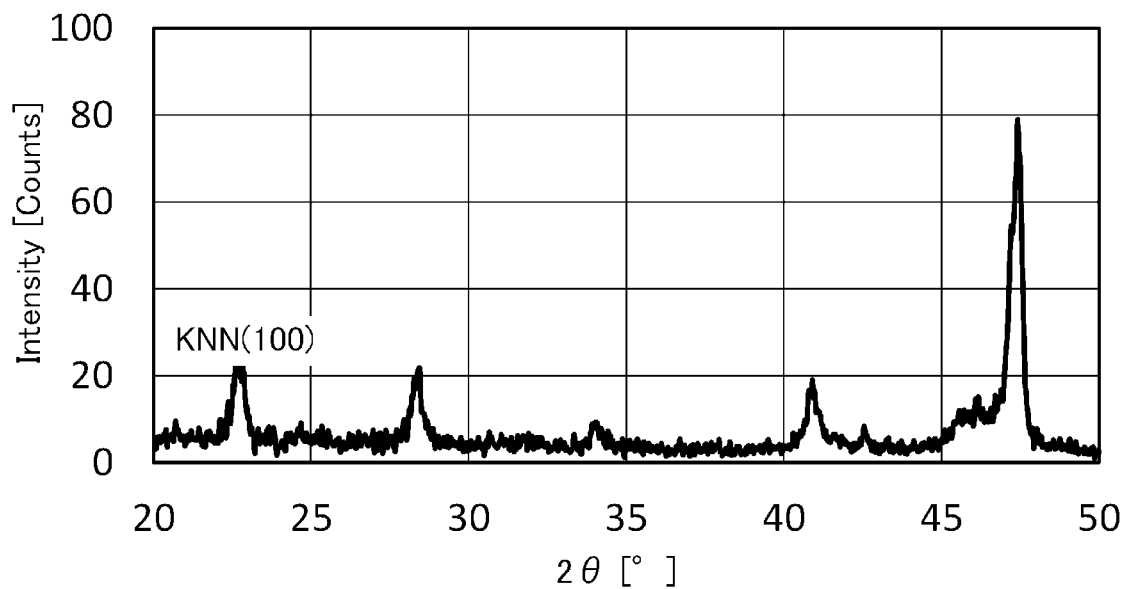
FIG. 9 shows X-ray diffraction measurement results of Example 2.
Figure 10:
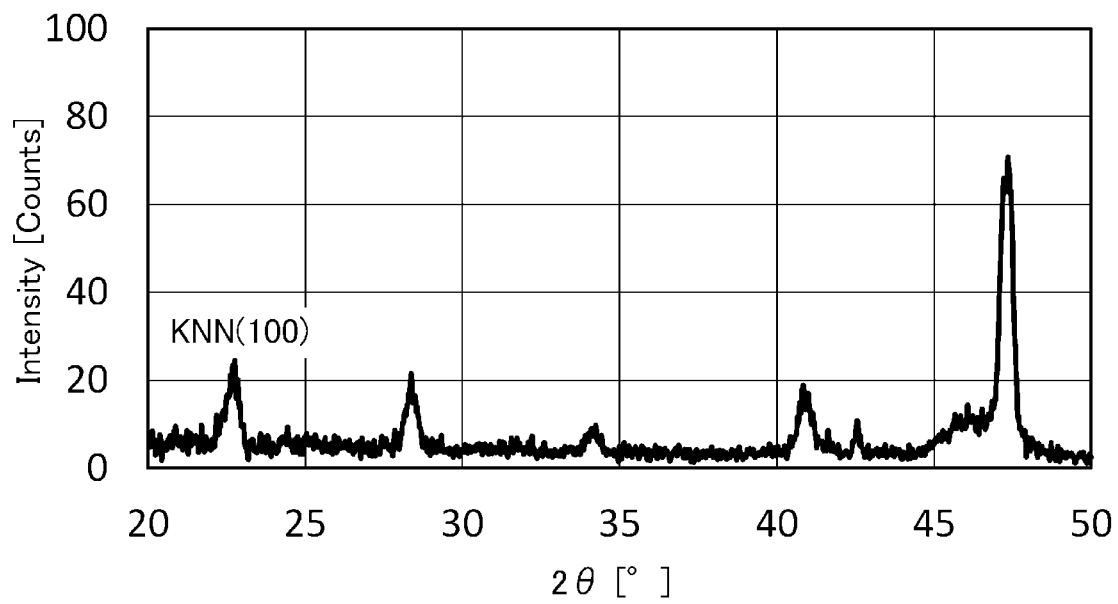
FIG. 10 shows X-ray diffraction measurement results of Example 3.
Figure 11:
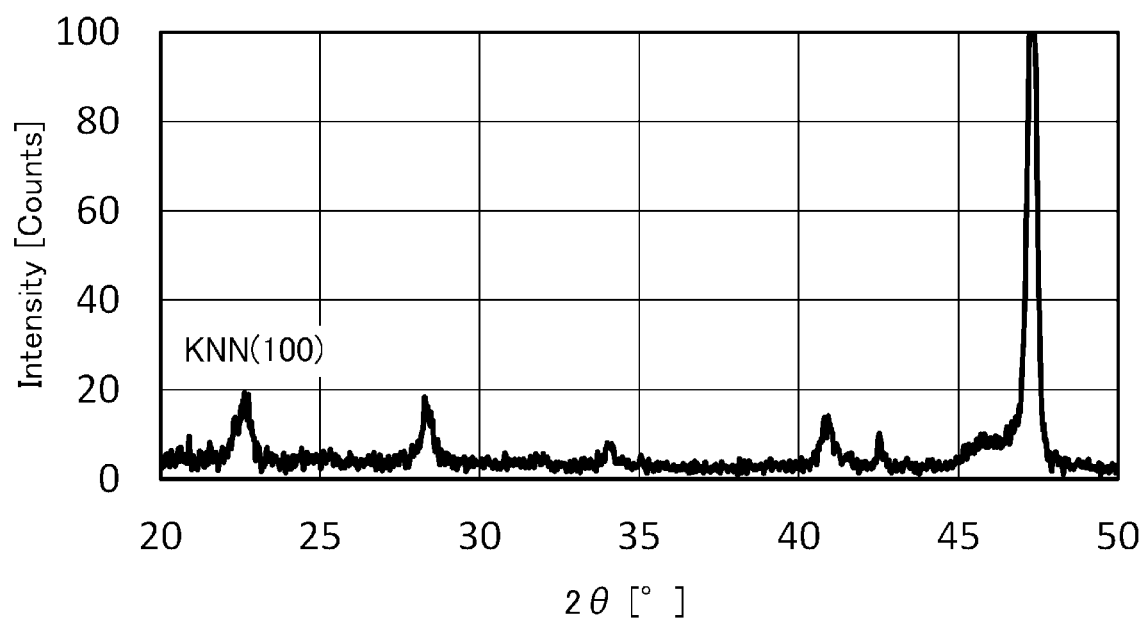
FIG. 11 shows X-ray diffraction measurement results of Example 6.
Figure 12:
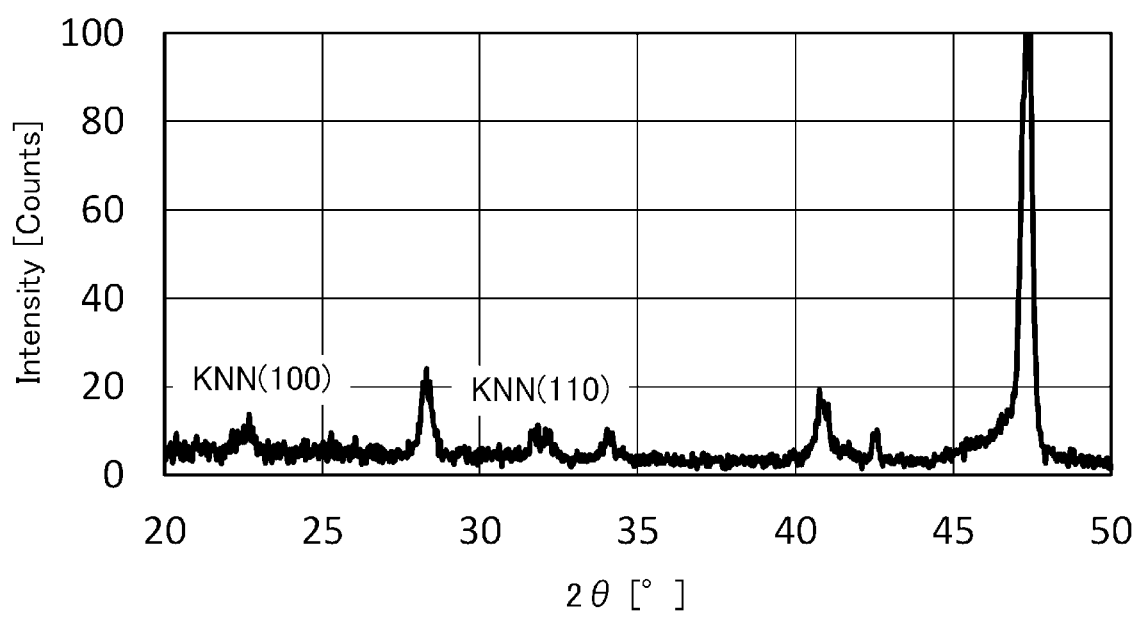
FIG. 12 shows X-ray diffraction measurement results of Comparative Example 1.
Figure 13:
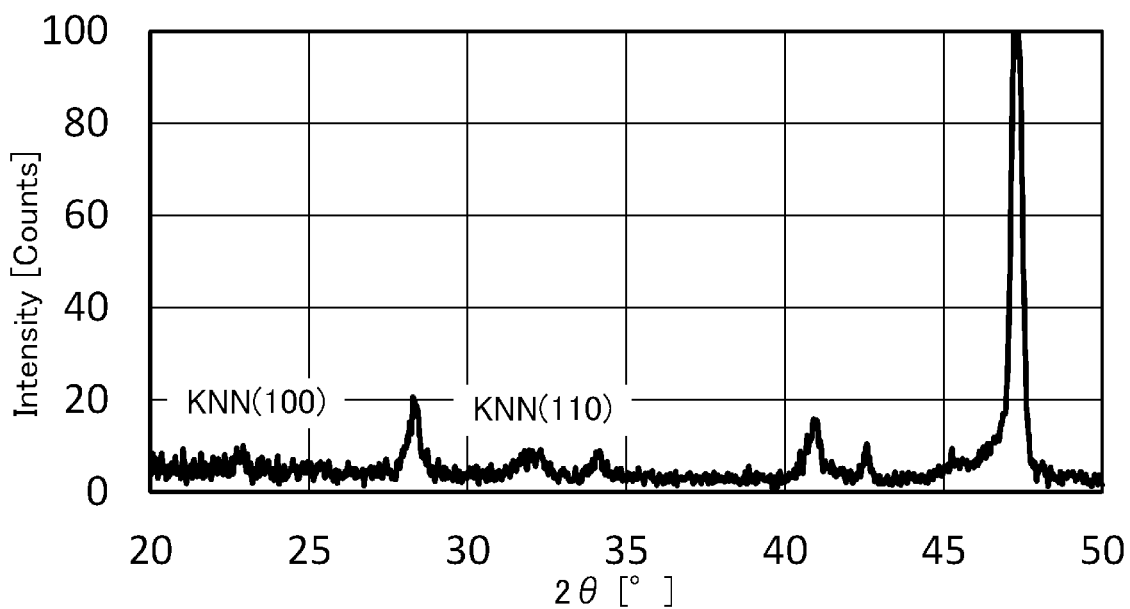
FIG. 13 shows X-ray diffraction measurement results of Comparative Example 2.

FIGS. 8 to 13 show results of XRD measurement after stacking two KNN layers as the second piezoelectric layer and before stacking a third layer. FIG. 8 shows the measurement results of Example 1. FIG. 9 shows the measurement results of Example 2. FIG. 10 shows the measurement results of Example 3. FIG. 11 shows the measurement results of Example 6. FIG. 12 shows the measurement results of Comparative Example 1. FIG. 13 shows the measurement results of Comparative Example 2.

Figure 14:
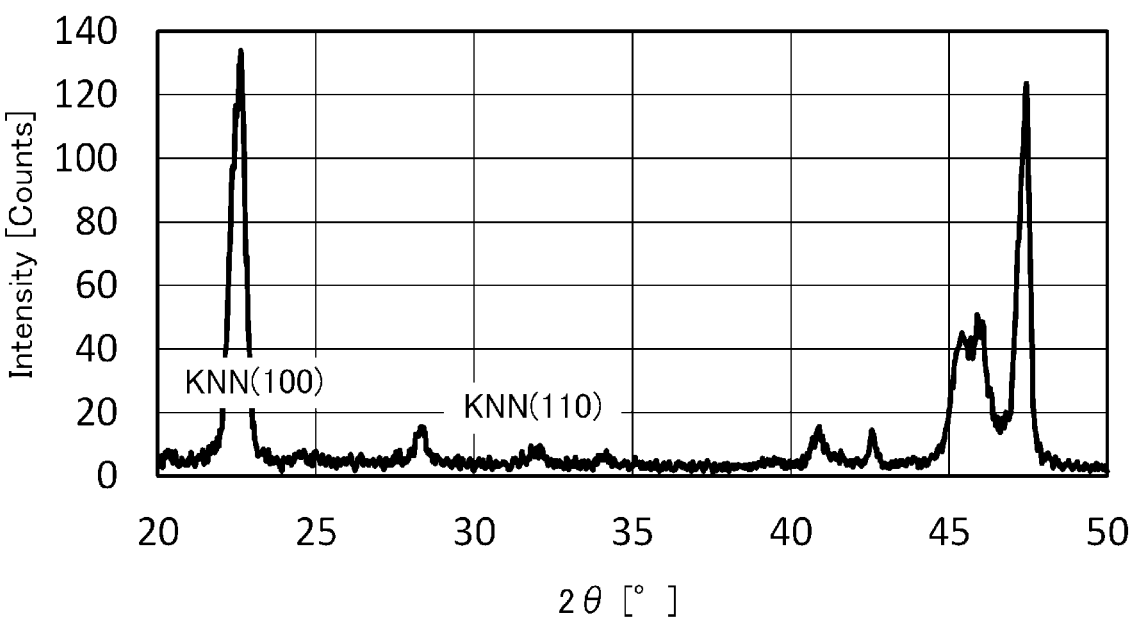
FIG. 14 shows X-ray diffraction measurement results of Example 6.
Figures 15, 16:
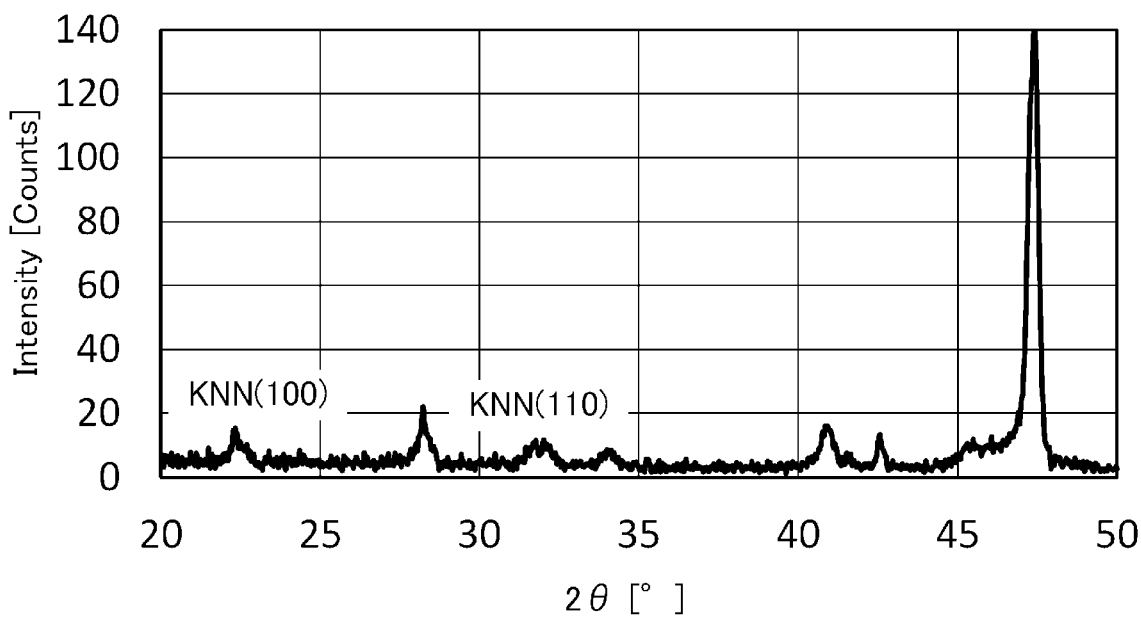
FIG. 15 shows X-ray diffraction measurement results of Comparative Example 1.
FIG. 16 is a table showing ratios of intensities in X-ray diffraction patterns of Examples 1 to 6 and Comparative Examples 1 and 2.

FIGS. 14 and 15 show results of XRD measurement after stacking KNN layers until a crack occurred. FIG. 14 shows the measurement results of Example 6. FIG. 15 shows the measurement results of Comparative Example 1.

As shown in FIGS. 8 to 11 and 14, in Examples 1 to 3 and 6, a (100) plane peak intensity of the KNN layer at around 2θ=22° was high and a (110) plane peak intensity of the KNN layer at around 2θ=32° could hardly be confirmed. On the other hand, in Comparative Examples 1 and 2, a (110) plane peak was confirmed at an intensity equal to or higher than that of a (100) plane peak. Further, a peak at around 45° to 46.5° is the secondary diffraction of the (100) plane of the KNN layer (that is, a (200) plane peak), and therefore, in FIG. 14 in which the intensity of the (100) plane is high, the intensity of the (200) plane strongly appears. In FIGS. 8 to 14, peaks other than at around 2θ=22°, 32°, and 45° to 46.5° are peaks attributed to other than the KNN layer.

FIG. 16 is a table showing the ratios R of Examples 1 to 6 and Comparative Examples 1 and 2. The ratio R is a ratio of the (100) plane peak intensity to the sum of the (100) plane peak intensity and the (110) plane peak intensity in the X-ray diffraction pattern of the second piezoelectric layer as described above. In FIG. 16, in Examples 1 to 4 and Comparative Example 2, the ratio R by XRD measurement after two KNN layers were stacked as the second piezoelectric layer and before the third layer was stacked is shown. Further, in Examples 5 and 6 and Comparative Example 1, the ratios R by XRD measurement after two KNN layers were stacked and before the third layer was stacked and after the KNN layers were stacked until a crack occurred are shown.

As shown in FIG. 16, the ratios R of Examples 1 to 6 were 0.60 or more. On the other hand, the ratios R of Comparative Examples 1 and 2 were less than 0.60. It was found that when the ratio R is 0.60 or more, a crack is less likely to occur. Further, it was found that when the ratio R is 0.75 or more, a crack is much less likely to occur.

5.4. SIMS MEASUREMENT

With respect to Example 6 and Comparative Example 1 after the KNN layers were stacked until a crack occurred, a composition distribution in the depth direction was examined by SIMS measurement. In the SIMS measurement, by using IMS-7f sector-type SIMS manufactured by CAMECA GmbH, raster scan was performed in a 100 μm square with 15 keV Cs+ as a primary ion at a beam current of 10 nA, and negative secondary ions were detected from a 33 μm φ at the center. The mass resolution was set to M/ΔM=5000. An electron gun was used for preventing charge-up.

Figure 17:
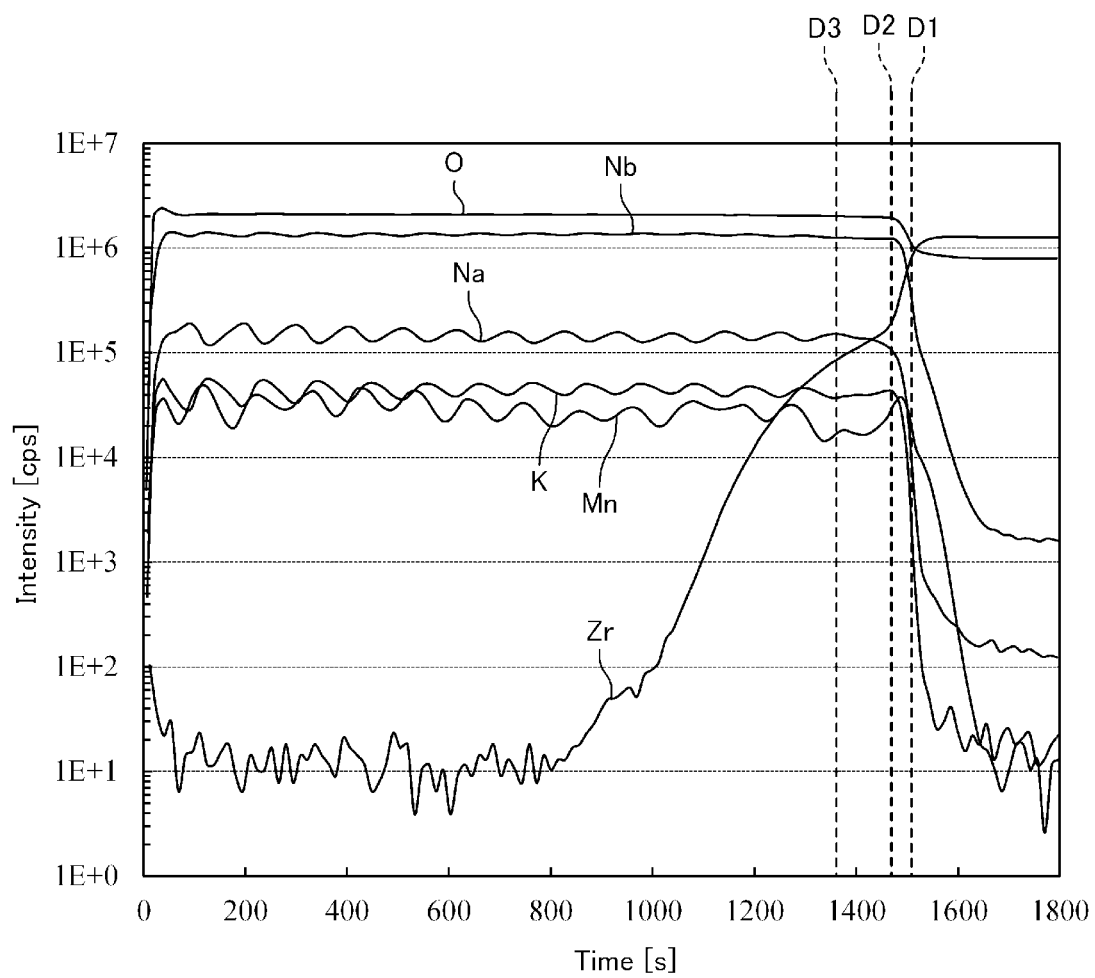
FIG. 17 shows secondary ion mass spectrometry measurement results of Example 6.
Figure 18:
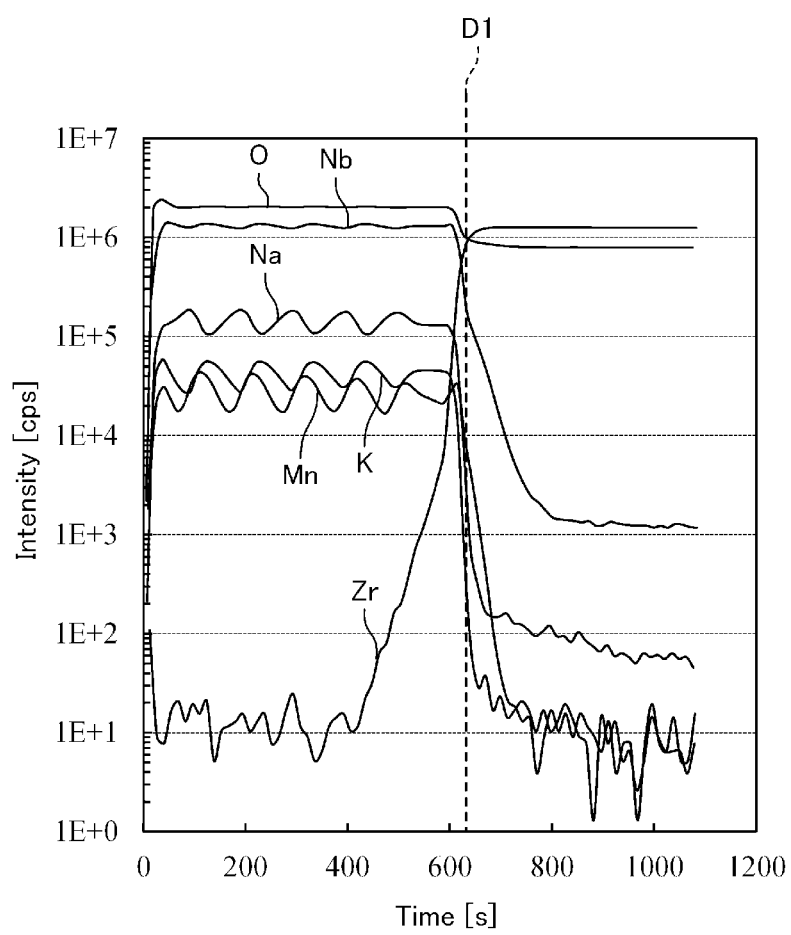
FIG. 18 shows secondary ion mass spectrometry measurement results of Comparative Example 1.

FIG. 17 shows the measurement results of Example 6. FIG. 18 shows the measurement results of Comparative Example 1. In FIGS. 17 and 18, potassium, sodium, niobium, manganese, oxygen, and zirconium profiles are shown. In FIGS. 17 and 18, the horizontal axis corresponds to the position in the depth direction.

In the SIMS measurement, the sensitivity is different for each element, and therefore, the intensity cannot be compared among different elements. Further, the film thickness of the KN layer of Example 6 is as small as 10 nm, and therefore, the KN layer could not be confirmed at the measurement speed in SIMS in FIG. 17.

As shown in FIG. 17, the potassium profile and the sodium profile alternately had maximum values. Further, the distance between the position D1 of the interface B between the piezoelectric layer and the zirconium oxide layer and the position D2 of the maximum value closest to the interface B among the plurality of maximum values of the potassium profile was smaller than the distance between the position D1 of the interface B and the position D3 of the maximum value closest to the interface B among the plurality of maximum values of the sodium profile.

In the above-mentioned "5. Examples and Comparative Examples", the first piezoelectric layer was provided on the $ZrO_2$ layer, however, it is considered that the same behavior as in the case of the $ZrO_2$ layer is exhibited even when a titanium oxide layer, an aluminum oxide layer, a tantalum oxide layer, or a silicon oxide layer is used in place of the $ZrO_2$ layer.

In the present disclosure, a part of the configuration may be omitted within a range in which the features and effects described herein are achieved, or the respective embodiments or variations may be combined.

The present disclosure is not limited to the above-mentioned embodiments, and further various modifications may be made. For example, the present disclosure includes substantially the same configurations as the configurations described in the embodiments. The substantially the same configurations are, for example, configurations having the same functions, methods, and results, or configurations having the same objects and effects. Further, the present disclosure includes configurations in which a part that is not essential in the configurations described in the embodiments is substituted. Further, the present disclosure includes configurations having the same effects as in the configurations described in the embodiments, or configurations capable of achieving the same objects as in the configurations described in the embodiments. In addition, the present disclosure includes configurations in which known techniques are added to the configurations described in the embodiments.

What is claimed is:

1. A piezoelectric element, comprising:
   a first electrode provided above a base body;
   a first piezoelectric layer provided so as to be in contact with the base body and cover the first electrode;
   a second piezoelectric layer provided above the first piezoelectric layer; and
   a second electrode provided above the second piezoelectric layer, wherein
   the first piezoelectric layer includes a composite oxide that contains potassium and niobium and that has a perovskite-type structure containing potassium as a main component at an A-site,
   the second piezoelectric layer includes a composite oxide that contains potassium, sodium, and niobium and that has a perovskite-type structure, and
   a local maximum value of a potassium atomic concentration (atm %) in the first piezoelectric layer is higher than a local maximum value of a potassium atomic concentration (atm %) in the second piezoelectric layer.

2. The piezoelectric element according to claim 1, wherein
   in profiles in a depth direction of the first piezoelectric layer and the second piezoelectric layer obtained by secondary ion mass spectrometry, a potassium profile and a sodium profile alternately have maximum values, and
   in the depth direction, a distance between a position of an interface between the first piezoelectric layer and the base body and a position of the maximum value closest to the interface among the plurality of maximum values of the potassium profile is smaller than a distance between the position of the interface and a position of the maximum value closest to the interface among the plurality of maximum values of the sodium profile.

3. The piezoelectric element according to claim 1, wherein in an X-ray diffraction pattern of the second piezoelectric layer, a ratio of a (100) plane peak intensity to a sum of the (100) plane peak intensity and a (110) plane peak intensity is 0.60 or more.

4. The piezoelectric element according to claim 3, wherein the ratio is 0.75 or more.

5. The piezoelectric element according to claim 1, wherein
   the base body includes a zirconium oxide layer, and
   the first piezoelectric layer is in contact with the zirconium oxide layer.

6. The piezoelectric element according to claim 1, wherein a sum of a film thickness of the first piezoelectric layer and a film thickness of the second piezoelectric layer is 500 nm or more.

7. A liquid ejection head, comprising:
   the piezoelectric element according to claim 1; and
   a nozzle plate provided with a nozzle hole for ejecting a liquid, wherein
   the base body includes a flow path forming substrate provided with a pressure generating chamber whose volume is changed by the piezoelectric element and a supply flow path, which communicates with the pressure generating chamber, and through which the liquid is supplied to the pressure generating chamber, and
   the nozzle hole communicates with the supply flow path.

8. A printer, comprising:
   the liquid ejection head according to claim 7;
   a conveyance mechanism for relatively moving a recording medium with respect to the liquid ejection head; and
   a control unit that controls the liquid ejection head and the conveyance mechanism.

9. A method for producing a piezoelectric element, comprising:
   forming a first electrode above a base body;
   forming a first piezoelectric layer so as to be in contact with the base body and cover the first electrode;
   forming a second piezoelectric layer above the first piezoelectric layer; and
   forming a second electrode above the second piezoelectric layer, wherein
   the first piezoelectric layer includes a composite oxide that contains potassium and niobium and that has a perovskite-type structure containing potassium as a main component at an A-site,
   the second piezoelectric layer includes a composite oxide that contains potassium, sodium, and niobium and that has a perovskite-type structure, and
   a local maximum value of potassium atomic concentration (atm %) in the first piezoelectric layer is higher than a local maximum value of a potassium atomic concentration (atm %) in the second piezoelectric layer.

10. A piezoelectric element, comprising:
    a first electrode provided above a base body;
    a first piezoelectric layer provided so as to be in contact with the base body and cover the first electrode;
    a second piezoelectric layer provided above the first piezoelectric layer; and
    a second electrode provided above the second piezoelectric layer,
    wherein the first piezoelectric layer includes a composite oxide that contains potassium and niobium and that has a perovskite-type structure containing potassium as a main component at an A-site,
    the second piezoelectric layer includes a composite oxide that contains potassium, sodium, and niobium and that has a perovskite-type structure,
    the first piezoelectric layer has a higher potassium atomic concentration (atm %) than the second piezoelectric layer,
    in an X-ray diffraction pattern of the second piezoelectric layer, a ratio of a (100) plane peak intensity to a sum of the (100) plane peak intensity and a (110) plane peak intensity is 0.75 or more.

11. The piezoelectric element according to claim 10, wherein
    in profiles in a depth direction of the first piezoelectric layer and the second piezoelectric layer obtained by secondary ion mass spectrometry, a potassium profile and a sodium profile alternately have maximum values, and
    in the depth direction, a distance between a position of an interface between the first piezoelectric layer and the base body and a position of the maximum value closest to the interface among the plurality of maximum values of the potassium profile is smaller than a distance between the position of the interface and a position of the maximum value closest to the interface among the plurality of maximum values of the sodium profile.

12. The piezoelectric element according to claim 10, wherein
    the base body includes a zirconium oxide layer, and
    the first piezoelectric layer is in contact with the zirconium oxide layer.

13. The piezoelectric element according to claim 10, wherein a sum of a film thickness of the first piezoelectric layer and a film thickness of the second piezoelectric layer may be 500 nm or more.

14. A liquid ejection head, comprising:

the piezoelectric element according to claim 10; and a nozzle plate provided with a nozzle hole for ejecting a liquid, wherein the base body includes a flow path forming substrate provided with a pressure generating chamber whose volume is changed by the piezoelectric element and a supply flow path, which communicates with the pressure generating chamber, and through which the liquid is supplied to the pressure generating chamber, and the nozzle hole communicates with the supply flow path.

15. A printer, comprising:

the liquid ejection head according to claim 14;

a conveyance mechanism for relatively moving a recording medium with respect to the liquid ejection head; and a control unit that controls the liquid ejection head and the conveyance mechanism.

\* \* \* \* \*